United States Patent
Sun

(10) Patent No.: US 9,438,198 B2
(45) Date of Patent: Sep. 6, 2016

(54) PIN DIODE CIRCUIT AND PIN DIODE ATTENUATOR

(71) Applicant: TELEFONAKTIEBOLAGET L M ERICSSON (PUBL), Stockholm (SE)

(72) Inventor: Honglei Sun, Nanjing (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/649,325

(22) PCT Filed: Dec. 3, 2012

(86) PCT No.: PCT/CN2012/085743
§ 371 (c)(1),
(2) Date: Jun. 3, 2015

(87) PCT Pub. No.: WO2014/085960
PCT Pub. Date: Jun. 12, 2014

(65) Prior Publication Data
US 2015/0333723 A1    Nov. 19, 2015

(51) Int. Cl.
*H01P 1/22* (2006.01)
*H03H 7/25* (2006.01)

(52) U.S. Cl.
CPC .............. *H03H 7/255* (2013.01); *H01P 1/22* (2013.01)

(58) Field of Classification Search
CPC .......... H01P 1/22; H01P 1/222; H01P 1/225; H01P 1/227; H03H 7/24; H03H 7/255; H03H 11/245
USPC ............................................ 333/81 R, 81 A
See application file for complete search history.

(56) References Cited

U.S. PATENT DOCUMENTS

| 4,216,445 | A | 8/1980 | Abajian |
| 4,224,583 | A | 9/1980 | Larkin |
| 6,091,299 | A | 7/2000 | Gruneisen |
| 6,973,288 | B1 | 12/2005 | Davis |
| 2003/0062967 | A1 | 4/2003 | Ritchey |
| 2007/0001738 | A1 | 1/2007 | Kawai |

(Continued)

FOREIGN PATENT DOCUMENTS

| CN | 1856946 A | 11/2006 |
| KR | 2002-0070571 A | 9/2002 |

OTHER PUBLICATIONS

Skyworks Solutions, Inc.; "Application Note, Design With PIN Diodes," Oct. 22, 2012.

(Continued)

*Primary Examiner* — Stephen E Jones

(57) ABSTRACT

A PIN diode circuit comprising a RF input coupled to a first junction point via a first DC blocking circuit and a constant voltage source coupled to the first junction point via a first DC feeding circuit, the constant voltage source configured to DC bias the first junction point. The PIN diode circuit further comprises a first PIN diode with an anode coupled to the first junction point and a cathode coupled to an anode of a second PIN diode via a second DC blocking circuit. The cathode of the second PIN diode is configured to be coupled to ground potential. The PIN diode circuit further comprises an adjustable voltage source coupled to a second junction point via a second DC feeding circuit. The second junction point is coupled to the cathode of the first PIN diode via a first resistor and is further coupled to the anode of the second PIN diode via a second resistor.

10 Claims, 3 Drawing Sheets

(56) References Cited

U.S. PATENT DOCUMENTS

2010/0134218 A1* 6/2010 Kobayashi .............. H03H 11/24
                                                        333/81 R
2010/0171576 A1   7/2010 LaGrandier et al.

OTHER PUBLICATIONS

TYCO Electronics; MACOM; "Linear Driver for PIN Diode Attenuators;" DR65-0002; V4.00; Dec. 24, 2007.

* cited by examiner

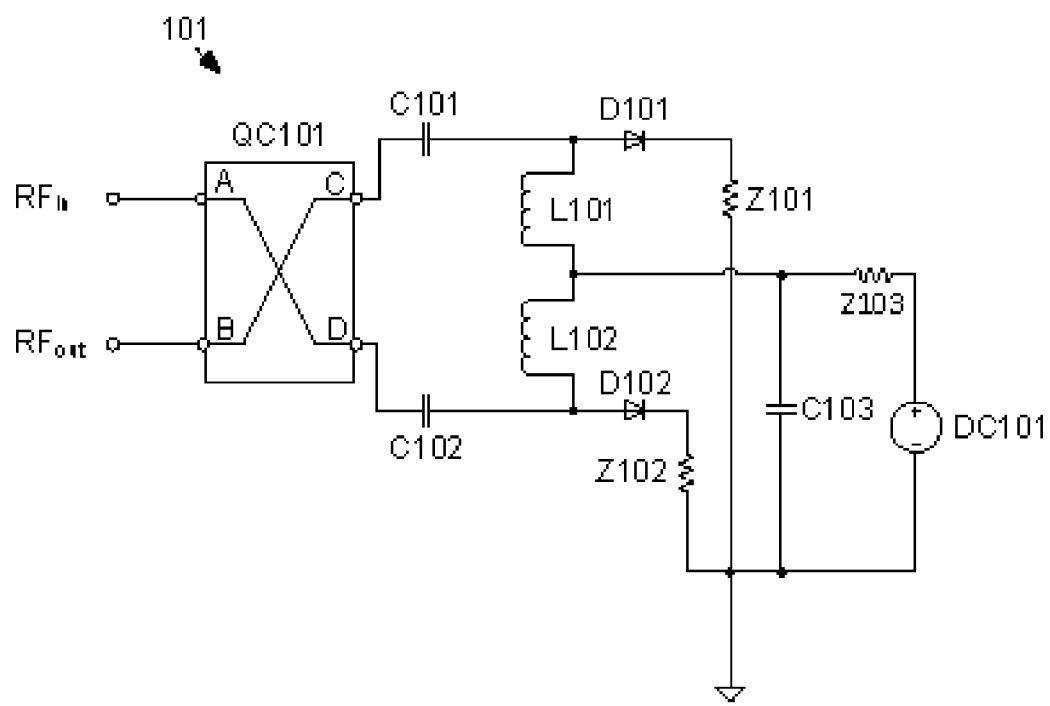
Fig. 1 Prior-art
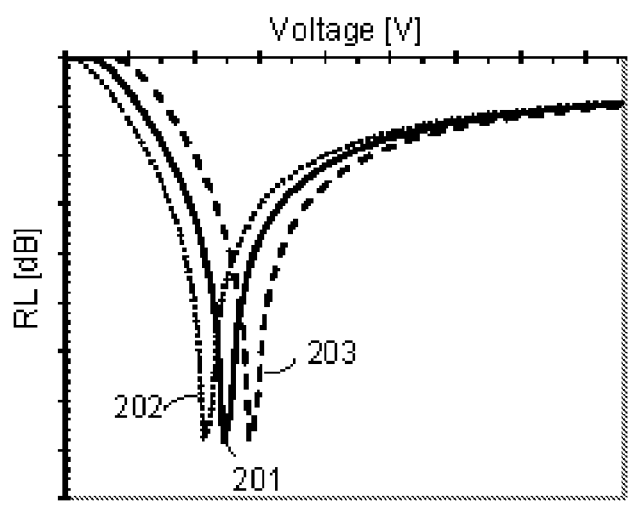
Fig. 2 Prior-art

PIN DIODE CIRCUIT AND PIN DIODE ATTENUATOR

This application is a 371 of International Application PCT/CN2012/085743, filed Dec. 3, 2012, the disclosure of which is fully incorporated herein by reference.

TECHNICAL FIELD

The present invention generally relates to the field of radio frequency circuits and more specifically to the field of PIN diode attenuators.

BACKGROUND

Attenuator circuits find wide usage in RF, UHF and microwave circuits. A common device of these attenuator circuits is a PIN diode. The PIN diode is fundamentally a device whose impedance at RF, UHF and microwave frequencies is controlled by a DC current through the PIN diode. The PIN diode is a semiconductor diode in which a high resistivity intrinsic I-region is sandwiched between a P-type and a N-type region. When the PIN diode is forward biased, holes and electrons are injected into the I-region. These charges do not immediately annihilate each other; Instead they stay alive for an average time called the carrier lifetime. This results in a an average stored charge which lowers the effective resistance of the I-region. Hence, the PIN diod functions as a voltage controlled resistor at said frequencies.

A PIN diode attenuator is a device that provides a predetermined value of attenuation in response to a precise stimulus, for example a voltage bias.

A classical implementation of a conventional PIN diode attenuator comprises a quadrature hybrid which is shown in FIG. 1. This conventional PIN diode attenuator provides matching impedance at all levels of attenuation and high linearity. However, this conventional PIN diode attenuator is very sensitive to intrinsic PIN diode fluctuations due to the bias voltage precision at high levels of attenuation. Hence, the notch point of the conventional PIN diode attenuator fluctuates due to intrinsic PIN diode variations. This results in limited repeatability of manufactured PIN diode attenuators. Calibration by means of generating look up tables for bias voltage versus the corresponding attenuation of the manufactured conventional PIN diode attenuator is required.

In order to improve the conventional PIN diode attenuator several solutions have been earlier suggested.

In US6,973,288B1 is a linearizer circuit disclosed. In this solution two attenuator control inputs are used, causing the complexity of the attenuator to increase. The basic function of this solution is to provide a linear relation between control signal and attenuation. A more severe drawback of this solution is that the attenuation will be sensitive to bias level due to the exponential relation between voltage and current in a PIN diode.

US20070001738 discloses a variable resistance circuit. In this solution the complexity is increased compared to the above mentioned solution. This solution utilizes an adder circuit to sum two signals from two different circuits comprising voltage sources and a zener diode. This solution also attempts to linearize the response from the variable resistance circuit. This solution also exhibits the earlier mentioned drawbacks of being sensitive to changes in the bias voltage. In addition some additional drawbacks are added due to temperature drift and manufacturing repeatability for the zener diode.

US6,091,299 discloses yet another solution aimed to linearize the response of a PIN diode attenuator by using an array of zener diodes. The array of zener diodes is used to generate a linear response. This circuit also requires a large amount of trimming in order to obtain a linear response, the complexity of the circuit is also increased.

US7,023,294 discloses a solution for linearizing a PIN diode network by means of a complex circuitry comprising several parallel resonant circuits causing a cancelling of unwanted parasitic reactance.

The known solutions in the art have drawbacks, which cause problems when put into operation.

SUMMARY

An object of the invention is therefore to address the problems and disadvantages outlined above, and to provide a solution that is robust and insensitive to bias variations and intrinsic PIN diode fluctuations.

This object and others are achieved by the PIN diode circuit and the PIN diode attenuator according to the independent claims.

A first embodiment provides a PIN diode circuit comprising, a RF input coupled to a first junction point via a first DC blocking circuit, a constant voltage source coupled to the first junction point via a first DC feeding circuit. The constant voltage source is configured to DC bias the first junction point. The PIN diode circuit further comprises a first PIN diode with the anode thereof coupled to the first junction point and the cathode thereof coupled to the anode of a second PIN diode via a second DC blocking circuit. The cathode of the second PIN diode is configured to be coupled to ground potential. The PIN diode circuit further comprises an adjustable voltage source coupled to a second junction point via a second DC feeding circuit. The second junction point is coupled to the cathode of the first PIN diode via a first resistor; the second junction point is further coupled to the anode of the second PIN diode via a second resistor. The RF resistance of the first PIN diode and the second PIN diode is controlled by means of adjusting the voltage of the adjustable voltage source between ground potential and the constant voltage provided by the constant voltage source at the first junction point.

A second embodiment provides a PIN diode attenuator comprising, a RF input port, a RF output port and a quadrature hybrid with a first port being connected to the RF input port and a second port being connected to the RF output port. The quadrature hybrids third port being connected to a first PIN diode circuit and a fourth port being connected to a second PIN diode circuit wherein the first and second PIN diode circuit each comprising a RF input coupled to a first junction point via a first DC blocking circuit, a constant voltage source coupled to the first junction point via a first DC feeding circuit. The constant voltage source is configured to DC voltage bias the first junction point. The PIN diode circuit further comprises a first PIN diode with the anode thereof coupled to the first junction point and the cathode thereof coupled to the anode of a second PIN diode via a second DC blocking circuit. The cathode of the second PIN diode is configured to be coupled to ground potential. The PIN diode circuit further comprises an adjustable voltage source coupled to a second junction point via a second DC feeding circuit. The second junction point is coupled to the cathode of the first PIN diode via a first resistor; the second junction point is further coupled to the anode of the second PIN diode via a second resistor.

Hence, the RF resistance between the RF input port and the RF output port is controlled by the adjustable voltage source of the first and the second PIN diode attenuators coupled to the third port and the fourth port of the quadrature hybrid.

An advantage of the embodiments described above is that they may allow for increased insensitivity towards bias voltage of the PIN diodes.

Yet another advantage of the embodiments described above is that they may allow a more robust operation and a limited increase in complexity.

Further advantages and features of embodiments of the present invention will become apparent when reading the following detailed description in conjunction with the drawings.

BRIEF DESCRIPTION OF THE DRAWINGS

FIG. 1 is a schematic drawing of a conventional PIN diode attenuator.

FIG. 2 is a diagram of return loss versus voltage bias for the conventional PIN diode attenuator.

DETAILED DESCRIPTION

Figure 3:
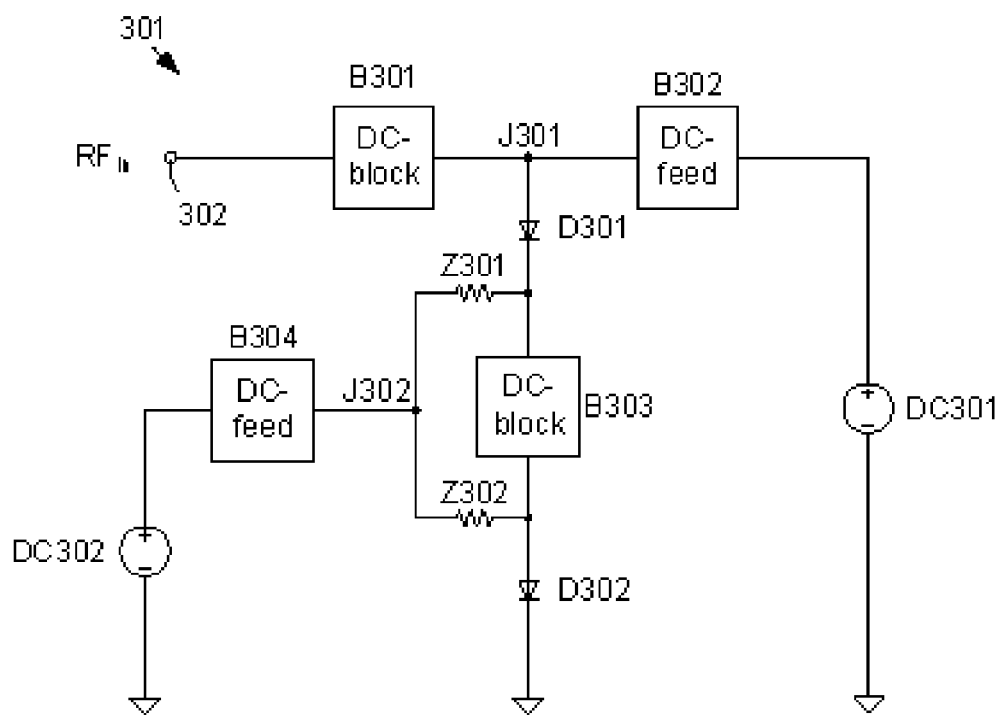
FIG. 3 is a schematic drawing of an embodiment of a PIN diode circuit.

In the following, different aspects will be described in more detail with references to certain embodiments and to the accompanying drawings. For purposes of explanation and not limitation, specific details are set forth, such as particular scenarios and techniques, in order to provide a thorough understanding of the different embodiments. However, other embodiments that depart from these specific details may also exist.

FIG. 1 illustrates a conventional PIN diode attenuator 101 comprising a quadrature hybrid QC101 with four ports A, B, C and D. The first port A being configured to receive RF power and the second port B being connected to a RF output of the conventional PIN diode attenuator 101. The third port C is connected to an anode of a first PIN diode D101 via a first capacitor C101. The first capacitor C101 prevents DC voltage to enter the quadrature hybrid QC101. The cathode of the first PIN diode D101 being configured to be connected to ground potential via a first resistor Z101. In order to provide the first PIN diode D101 with a voltage bias an adjustable voltage source DC101 is connected to the anode of the first PIN diode D101 via a series resistor Z103 and an inductor L101, wherein the inductor L101 prevents RF power to enter the adjustable voltage source DC101. Accordingly, since the conventional PIN diode attenuator is a symmetric device, the fourth port D is connected to an anode of a second PIN diode D102 via a second capacitor C102. The second capacitor C102 prevents DC voltage to enter the quadrature hybrid QC101. The cathode of the second PIN diode D102 being configured to be connected to ground potential via a second resistor Z102. In order to provide the second PIN diode D102 with a voltage bias the adjustable voltage source DC101 is connected to the anode of the first PIN diode D101 via the series resistor Z103 and a series inductor L102.

The quadrature hybrid QC101 is a well-known commercially available device comprising four ports A, B, C, D adapted for RF signals. The operation of the quadrature hybrid will shortly be described in the following section.

Assume, that the quadrature hybrid QC101 is supplied with RF power at the first port A, and that the third port C and the fourth port D being matched and that the quadrature hybrid is essentially lossless. In such a case the second port B will be isolated and the power flowing into to the first port A will be evenly divided between the third port C and to the fourth port D.

Hence, the operation of the conventional PIN diode attenuator is easily derived from the fact that a PIN diode from a RF point of view essentially is a voltage dependent resistor controlled by the forward voltage. Accordingly, the amount of RF power that will be forwarded from port A to port B of the quadrature hybrid QC101 can be controlled by means of the DC voltage bias causing a DC current through the first PIN diode D101 and the second PIN diode D102 that reduces the RF resistance of the diodes.

However, real non-ideal PIN diodes exhibits some fluctuations causing the PIN diode attenuator to be sensitive towards DC bias also temperature drift of the PIN diodes have a large impact on the effective RF resistance of the PIN diodes.

The conventional PIN diode attenuators dependency on the bias voltage is clearly illustrated in FIG. 2. In this figure bias voltage is plotted against return loss of the conventional PIN diode attenuator 101, see FIG. 1. This FIG. 2 shows the resulting performance of the PIN diode attenuator with three different PIN diodes that exhibit different characteristics due to intrinsic fluctuations. The solid line 201 illustrates a conventional PIN diode attenuator 101 with a nominal PIN diode. The dotted line 202 and the dashed line 203 each corresponding to different PIN diodes having fluctuating characteristics. The difference in the position of the minimum return loss indicates the severe bias dependency of this circuit. Accordingly, this conventional PIN diode attenuator 101 requires extensive trimming of the DC bias voltage in order to achieve the desired attenuation for a given level of bias voltage. Another disadvantage of this conventional PIN diode attenuator is that at minimum return loss a phase shift occurs. Therefore, it is not possible to place the voltage bias at the point of minimum return loss due to the fact that a small drift of the characteristics will cause a severe phase shift.

In FIG. 3 is an embodiment of a PIN diode circuit, generally designated 301 disclosed. The PIN diode circuit 301 comprises a RF input 302 coupled to a first junction point J301 via a first DC blocking circuit B301. This DC blocking circuit may comprise a series capacitor in order to provide good DC isolation of the RF input 302 relative the first junction point J301. Accordingly, the DC blocking circuit B301 prevents the DC bias at the first junction point J301 to bias the RF input 302.

The PIN diode circuit 301 further comprises a constant voltage source DC301 being coupled to the first junction point J301 via a first DC feeding circuit B302, wherein the constant voltage source DC301 is configured to DC voltage bias the first junction point J301. The DC feeding circuit B302 may comprise a series inductance that prevents RF power from entering the constant voltage source DC301.

The PIN diode circuit 301 further comprises a first PIN diode D301 with the anode thereof coupled to the first junction point J301 and the cathode thereof coupled to the anode of a second PIN diode D302 via a second DC blocking circuit B303. The cathode of the second PIN diode D302 is configured to be coupled to ground potential of the PIN diode circuit 301.

The PIN diode circuit 301 further comprises an adjustable voltage source DC302 coupled to a second junction point J302 via a second DC feeding circuit B304. The second junction point J302 is coupled to the cathode of the first PIN diode D301 via a first resistor Z301, the second junction point J302 is further coupled to the anode of the second PIN diode D302 via a second resistor Z302.

The operation of the PIN diode circuit 301 will now be explained briefly in the following paragraphs using a number of different scenarios. Assume that the constant voltage source DC301 is configured to provide a first DC bias at the first junction point J301. This DC bias may be at least twice the desired forward voltage drop for each of the first and the second PIN diode D301, D302.

In a first scenario, assume that the adjustable voltage source DC302 is adjusted to provide ground potential at the second junction point J302. This ground potential at the second junction point J302 causes a voltage drop essentially equal to the first DC voltage bias over the first PIN diode D301 causing the same to act as a low resistance resistor. However, the ground potential at the second junction point J302 also causes a voltage drop over the second PIN diode D302 of essentially zero volts. Hence, the second PIN diode D302 is essentially not forward biased. Accordingly, the second PIN diode acts as a high resistance resistor.

Figure 4:
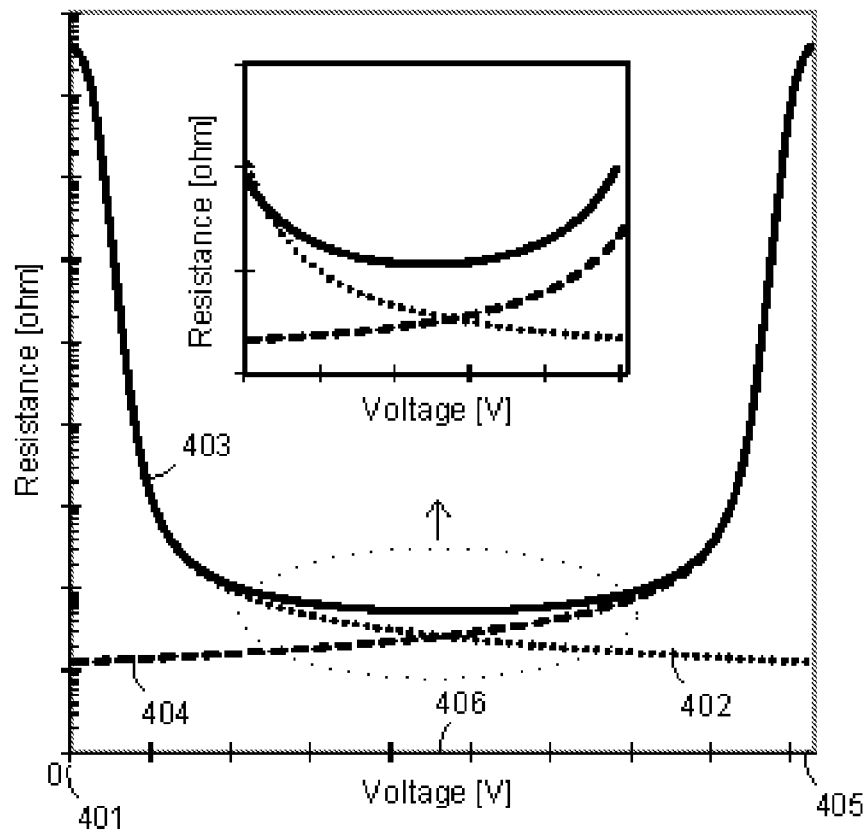
FIG. 4 is a diagram of RF resistance versus voltage bias for the PIN diode circuit.

Thereby, no RF path to ground exists when the second junction point J302 is at ground potential. This situation is illustrated in FIG. 4 in a first point 401 referring to a first bias voltage in a diagram of RF resistance versus DC bias voltage of the adjustable voltage source DC302. In this diagram a dotted line 402 is used to show the RF resistance of the second PIN diode D302 and a dashed line 404 is used to show the RF resistance of the first PIN diode D301. The sum of the RF resistance of the first and the second PIN diode D301, D302 is illustrated in this diagram with a solid line 403. This sum of RF resistance 403 is the effective RF resistance between the RF input of the PIN diode circuit 301 to ground. Hence, at a DC bias voltage in the first point 401 the RF resistance of the first PIN diode D301 is low and the RF resistance of the second PIN diode D302 is high. Accordingly, the sum of RF resistance for the first and the second PIN diode is high causing a high resistance path to ground.

In a second scenario, assume that the adjustable voltage source DC302 is adjusted to provide a high potential at the second junction point J302 illustrated in a second point 405 in FIG. 4. This high potential may be close to the potential at the first junction point J301 caused by the constant voltage source DC301. This high potential at the second junction point J302 causes a voltage drop essentially equal to zero over the first PIN diode D301, causing the same to act as a high resistance resistor. However, the high potential at the second junction point J302 also causes a voltage drop over the second PIN diode D302 that is essentially equal to the high potential at the first junction point J301. Hence, the second PIN diode D302 exhibits low RF resistance. This second scenario is illustrated in FIG. 4 in the second point 405. Accordingly the sum of RF resistance from the RF input of the PIN diode circuit 301 to ground is high also in this second scenario.

Now in a third scenario the adjustable voltage source DC302 is adjusted to provide a DC voltage bias at the second junction point J302 that may be close to half the potential at the first junction point J301. This potential causes a voltage drop of approximately half the voltage potential at the first junction point J301 over each of the first and the second PIN diode D301, D302. Consequently, the RF resistance for the first and the second PIN diode D301, D302 is low, causing also the sum of RF resistance to be low. This third scenario is illustrated in FIG. 4 in a third point 406 referring to a bias voltage between the first point 401 and the second point 405.

In FIG. 4 an insert of a small region close to the third point 406 is added to illustrate, by using a linear axis for the resistance, the relation between the RF resistances in the PIN diode circuit 301.

In one embodiment may the third point 406 be situated in the middle of the interval between the first point 401 and the second point 405.

Hence, the RF resistance between the RF input and the ground potential of the PIN diode circuit 301 can be adjusted by means of adjusting the adjustable voltage source DC302. The sum of the RF resistance is shown in FIG. 4 as the solid line 403. The solid line 403 exhibits very nice properties with respect to the DC bias voltage.

One especially beneficial feature of the PIN diode circuit 301 is that this circuit is less sensitive to intrinsic fluctuations of the first PIN diode D301 and the second PIN diode D302 compared to other circuits. This beneficial feature can be understood by noting that the DC current flowing through the first PIN diode D301 is almost independent of the current flowing through the second PIN diode D302, and vice versa. This independence comes from the DC biasing of the second junction point J302 by means of the adjustable voltage source DC302.

In one embodiment of the PIN diode circuit is the first resistor Z301 and the second resistor Z302 each 50 ohm. This resistance may be used for a transmission line impedance of 50 ohm connected to the RF input.

Figure 5:
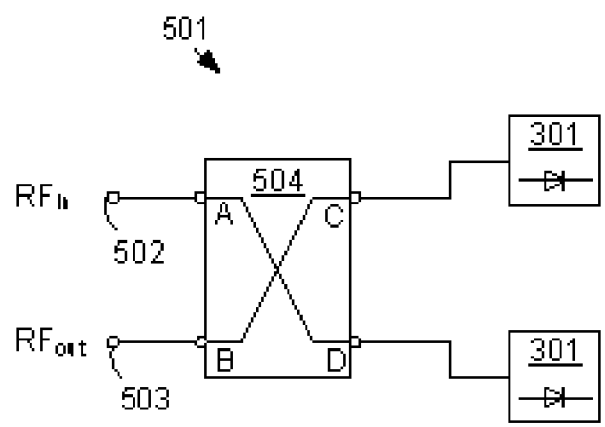
FIG. 5 is a schematic drawing of an embodiment of a PIN diode attenuator.

Now with reference made to FIG. 5 an embodiment of a PIN diode attenuator 501 will be described. The PIN diode attenuator 501 comprises a RF input port 502 and a RF output port 503. The PIN diode attenuator 501 further comprises a quadrature hybrid 504 with a first port A being connected to the RF input port 502 and a second port B being connected to the RF output port 503. The quadrature hybrids third port C being connected to a first PIN diode circuit 301 and a fourth port D being connected to a second PIN diode circuit 301.

The operation of the PIN diode attenuator 501 is easily explained using the explanation from the paragraphs covering the operation of the PIN diode circuit 301. The adjustable voltage source of each of the first and second PIN diode circuits 301 may be adjusted to either a ground potential or a potential close or equal to the constant voltage potential at the first junction point in the first and second PIN diode circuit 301, respectively. Such a voltage bias at the second junction point J302 will cause the RF power entering the first port A to be reflected at the third port C and the fourth port D. Consequently, the RF power will exit the second port B with small losses and the return loss will be small.

If on the other hand the adjustable voltage source for each of the first and second PIN diode circuits 301 is adjusted to a potential causing both the first PIN diode D301 and the second PIN diode D302 to have a significantly lower resistance or a potential close or equal to the constant voltage potential at the first junction point in the first and second PIN diode circuit 301, respectively. Such a voltage bias at the second junction point J302 for each of the PIN diode circuits will cause the RF power entering the first port A to be absorbed and grounded at the third port C and the fourth port D. Consequently, essentially no RF power will exit the second port B causing the same to be isolated and the corresponding return loss becomes small.

Figure 6:
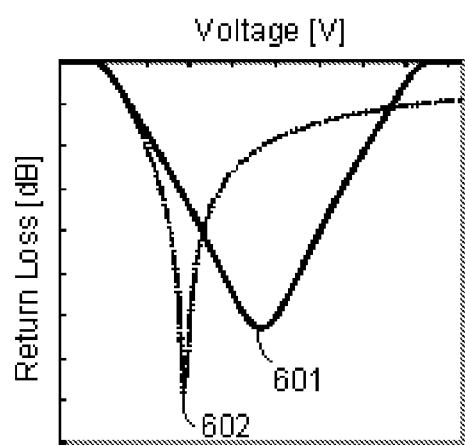
FIG. 6 is a diagram of return loss versus voltage bias for an embodiment of a PIN diode attenuator and a conventional PIN diode attenuator, respectively.

FIG. 6 is a diagram of return loss versus the voltage bias of the adjustable voltage source for a conventional PIN diode attenuator and an embodiment of a PIN diode attenuator 501. In this FIG. 6 a solid line 601 is used to show the return loss for an embodiment of the PIN diode attenuator 501 and a dotted line 602 is used to show the return loss of a conventional PIN diode attenuator according to FIG. 1.

The return loss 601 of the conventional PIN diode attenuator exhibits a very narrow region with maximum return loss, causing large demands on the precise bias of the adjustable voltage source. The embodiment of a PIN diode attenuator 501 exhibits a much broader region with high return loss causing the demands of the precise bias to become less demanding.

Figure 7:
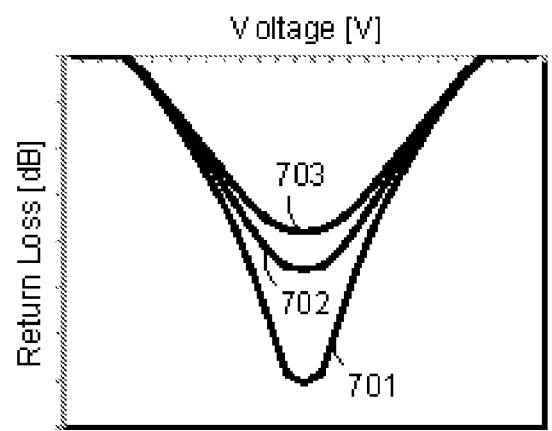
FIG. 7 is a diagram of return loss versus voltage bias for an embodiment of a PIN diode attenuator with fluctuating PIN diodes.

FIG. 7 is a diagram of return loss versus voltage bias provided by the adjustable voltage source DC301 in the first and the second PIN diode circuit of the PIN diode attenuator 501. In these figure three curves 701, 702, 703 are used to illustrate the beneficial characteristics of an embodiment of a PIN diode attenuator 501. These curves illustrate how the minimum return loss may only change in amplitude of the return loss and not in voltage bias position. Therefore, this figure suggests that by using an embodiment of the PIN diode attenuator 501 it is possible to voltage bias the PIN diodes close to the minimum return loss.

In an embodiment of the PIN diode attenuator may the adjustable voltage source of the PIN diode circuit 301 for each of the first and the second PIN diode circuit be controlled simultaneously with the same voltage bias.

In yet another embodiment may the adjustable voltage source comprise a digital to analogue converter operable for controlling the adjustable voltage bias at the second junction point.

The invention claimed is:

1. A PIN diode circuit comprising:
    a RF input coupled to a first junction point via a first DC blocking circuit;
    a constant voltage source coupled to the first junction point via a first DC feeding circuit, wherein the constant voltage source is configured to DC bias the first junction point;
        a first PIN diode with an anode thereof coupled to the first junction point and a cathode thereof coupled to an anode of a second PIN diode via a second DC blocking circuit, wherein the cathode of the second PIN diode is configure to be coupled to ground potential;
        an adjustable voltage source coupled to a second junction point via a second DC feeding circuit, wherein the second junction point is coupled to the cathode of the first PIN diode via a first resistor, the second junction point is further coupled to the anode of the second PIN diode via a second resistor;
        whereby the RF resistance of the first PIN diode and the second PIN diode are controlled by means of adjusting the voltage of the adjustable voltage source between ground potential and the constant voltage provided by the constant voltage source at the first junction point.

2. The PIN diode circuit according to claim 1, wherein said first and said second DC feeding circuit comprises a series inductor.

3. The PIN diode circuit according to claim 1, wherein said first and said second DC blocking circuit comprises a series capacitor.

4. The PIN diode circuit according to claim 1, wherein the adjustable voltage source comprises a digital to analog converter.

5. The PIN diode circuit according to claim 1, wherein the first and the second resistor each is 50 ohm.

6. A PIN diode attenuator comprising:
    a RF input port;
    a RF output port;
    a quadrature hybrid with a first port being connected to the RF input port and a second port being connected to the RF output port, the quadrature hybrids third port being connected to a first PIN diode circuit and a fourth port being connected to a second PIN diode circuit, wherein the first and second PIN diode circuit each comprising:
    a RF input coupled to a first junction point via a first DC blocking circuit;
    a constant voltage source coupled to the first junction point via a first DC feeding circuit, wherein the constant voltage source is configured to DC bias the first junction point;
    a first PIN diode with an anode thereof coupled to the first junction point and a cathode thereof coupled to an anode of a second PIN diode via a second DC blocking circuit, wherein the cathode of the second PIN diode is configured to be coupled to ground potential;
    an adjustable voltage source coupled to a second junction point via a second DC feeding circuit, wherein the second junction point is coupled to the cathode of the first PIN diode via a first resistor, the second junction point is further coupled to the anode of the second PIN diode via a second resistor;
    whereby the RF resistance between the RF input port and the RF output port is controlled by the adjustable voltage source of the first and the second PIN diode attenuators coupled to the two output ports of the quadrature hybrid.

7. The PIN diode attenuator according to claim 6, wherein said first and said second DC feeding circuit comprises a series inductor.

8. The PIN diode attenuator according to claim 6, wherein said first and said second DC blocking circuit comprises a series capacitor.

9. The PIN diode attenuator according to claim 6, wherein the first and the second resistor each is 50 ohm.

10. The PIN diode attenuator according to claim 6, wherein the adjustable voltage source of the first PIN diode attenuator and the second PIN diode attenuator is controlled simultaneously.

* * * * *